(12) United States Patent
Lee (10) Patent No.: US 8,274,853 B2
(45) Date of Patent: Sep. 25, 2012

(54) SEMICONDUCTOR DEVICE AND METHOD FOR TESTING THE SAME

(75) Inventor: Won Hee Lee, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 104 days.

(21) Appl. No.: 12/980,231

(22) Filed: Dec. 28, 2010

(65) Prior Publication Data

US 2011/0228621 A1 Sep. 22, 2011

(30) Foreign Application Priority Data

Mar. 22, 2010 (KR) .................. 10-2010-0025341

(51) Int. Cl.
*G11C 29/00* (2006.01)
(52) U.S. Cl. ........................................ 365/201; 365/203
(58) Field of Classification Search .................. 365/201, 365/203, 207
See application file for complete search history.

(56) References Cited

U.S. PATENT DOCUMENTS

| 5,428,574 A * | 6/1995 | Kuo et al. ................... 365/201 |
| 6,925,022 B2 * | 8/2005 | Arimoto et al. ............. 365/222 |
| 2004/0145959 A1 * | 7/2004 | Kuge et al. ............. 365/230.03 |
| 2011/0075498 A1 * | 3/2011 | Song et al. ................... 365/201 |

* cited by examiner

*Primary Examiner* — Anh Phung (57) ABSTRACT

A semiconductor device and a method for testing the same are disclosed, relating to a technology for simultaneously screening an off-leakage-current fail caused by a passing gate effect and a neighbor gate effect. The semiconductor device includes a memory cell configured to read and write data; a sense amplifier configured to sense and amplify cell data received from the memory cell through a pair of bit lines; a bit line precharge unit configured to equalize the pair of bit lines to a level of a ground voltage in response to a bit line equalization signal; a precharge voltage generator configured to provide the ground voltage to the bit line precharge unit during a test mode; and a test controller configured to, during the test mode, maintain an activation state of the bit line equalization signal during a test mode period, and control the sense amplifier to be deactivated.

24 Claims, 8 Drawing Sheets

SEMICONDUCTOR DEVICE AND METHOD FOR TESTING THE SAME

CROSS-REFERENCE TO RELATED APPLICATION

The priority of Korean patent application No. 10-2010-0025341 filed on Mar. 22, 2010, the disclosure of which is hereby incorporated in its entirety by reference, is claimed.

BACKGROUND OF THE INVENTION

Embodiments of the present invention relate to a semiconductor device and a method for testing the same, and more specifically, to a technology for simultaneously screening an off-leakage-current fail caused by a passing gate effect and a neighbor gate effect.

In recent times, vertical-type cell transistors have been rapidly introduced to the market due to the increasing level of integration. However, in the case of using vertical-type cell transistors, capacitance between word lines is increased, resulting in a defective cell or failed cell operation. The number of defective or failed cells is rapidly increased with the increasing level of integration.

In a manufactured product of 100 nm or more that uses a cell transistor as a planar gate, a failed cell caused by an operation of a neighbor gate is not an issue. However, failed parts (also called a fail phenomenon) caused by the neighbor gate operation have been increasingly generated in the sub 100 nm technology that uses a recess gate.

Specifically, the fail phenomenon caused by the neighbor gate operation in the sub 100 nm technology that uses a recess gate has been detected in an actual wafer level test. The fail phenomenon is becoming severe as the level of integration continues to increase.

That is, after the development of 80 nm technology, a recess and a bulb-shaped gate have been used in an active region. Since a channel region is located below a junction region, cell function under a small critical dimension is unavoidably deteriorated due to the field influence caused by proximity with a neighbor passing gate or a neighbor gate. Such deterioration may immediately lead to a fail of the off-leakage current, so that serious quality problems such as a March Cache OFF and the like may occur in a packaging step and a modularizing step.

Figure 1A:
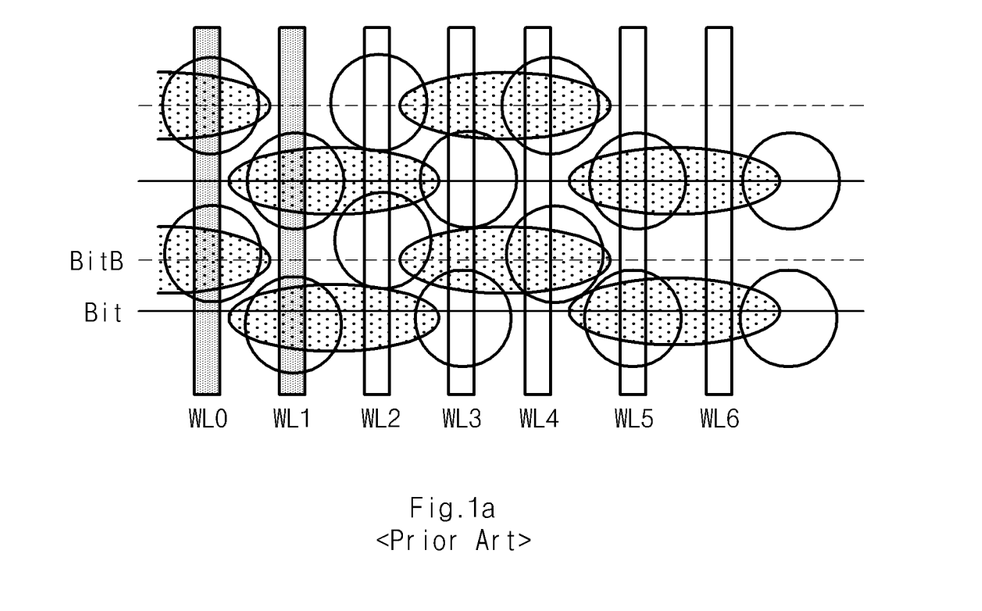
FIGS. 1A and 1B are conceptual diagrams illustrating a passing gate effect and a neighbor gate effect encountered in a conventional cell transistor.
Figure 1B:
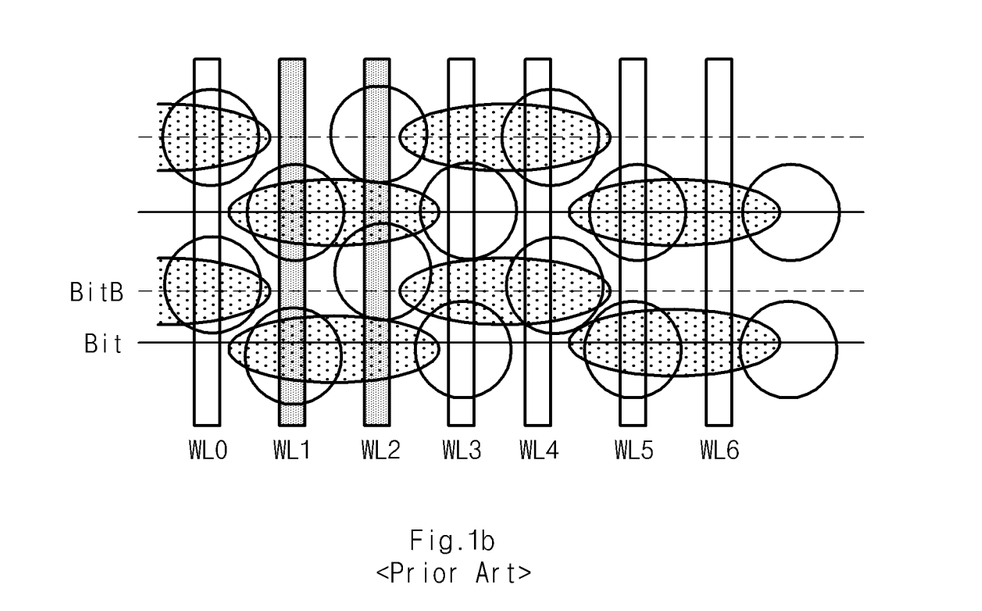

FIGS. 1A and 1B are conceptual diagrams illustrating a passing gate effect and a neighbor gate effect encountered in a conventional cell transistor.

In this case, the passing gate effect or the neighbor gate effect may indicate an exemplary phenomenon. That is, when a word line selected by an active command is enabled to a pumping voltage (VPP) level, a threshold voltage of a cell transistor corresponding to a turned-off neighbor word line is reduced.

FIG. 1A schematically shows the passing gate effect. The passing gate effect is as follows. That is, in the case of the passing gate effect, if the word line WL1 is enabled, a threshold voltage of a cell transistor of the word line WL0 corresponding to another neighbor active region is reduced.

FIG. 1B shows a neighbor gate effect. The neighbor gate effect is as follows. That is, in the case of the neighbor gate effect, if the word line WL1 is enabled, a threshold voltage of a cell transistor of the word line WL2 corresponding to the same active region is reduced.

In this way, if the threshold voltage of the cell transistor corresponding to a neighbor word line is lowered, an amount of an off-leakage current is increased, resulting in the occurrence of a defective cell.

In other words, the fail caused by the neighbor gate operation removes an "under margin" of a threshold voltage of the cell transistor, such that there arises a fail causing the off-leakage current. As tRAS time of the active region is increased, the possibility of a fail is also increased.

In this case, tRAS time indicates a specific time counted before a precharge operation is performed after the active operation. That is, the tRAS time is a predetermined time that is counted until a sufficient amount of charge is restored in a memory cell after the active operation.

In a memory product, a general active command can enable only one word line. The passing gate effect and the neighbor gate effect that are dependent upon a low margin of the cell threshold voltage are generated at a time at which the word line is enabled.

From the viewpoint of a test aspect, it is necessary to increase the tRAS time such that a sufficient time capable of screening the passing gate effect and the neighbor gate effect can be guaranteed.

However, if the tRAS time is controlled to be long without any plan, there arises an unexpected problem in a test time. That is, if a user attempts to screen all cells in a conventional memory product in which only one word line is enabled according to one active command, the test time is unnecessarily extended.

Therefore, there is needed a method for reducing a test time that screens the passing gate effect and the neighbor gate effect in a recess gate.

Figure 2:
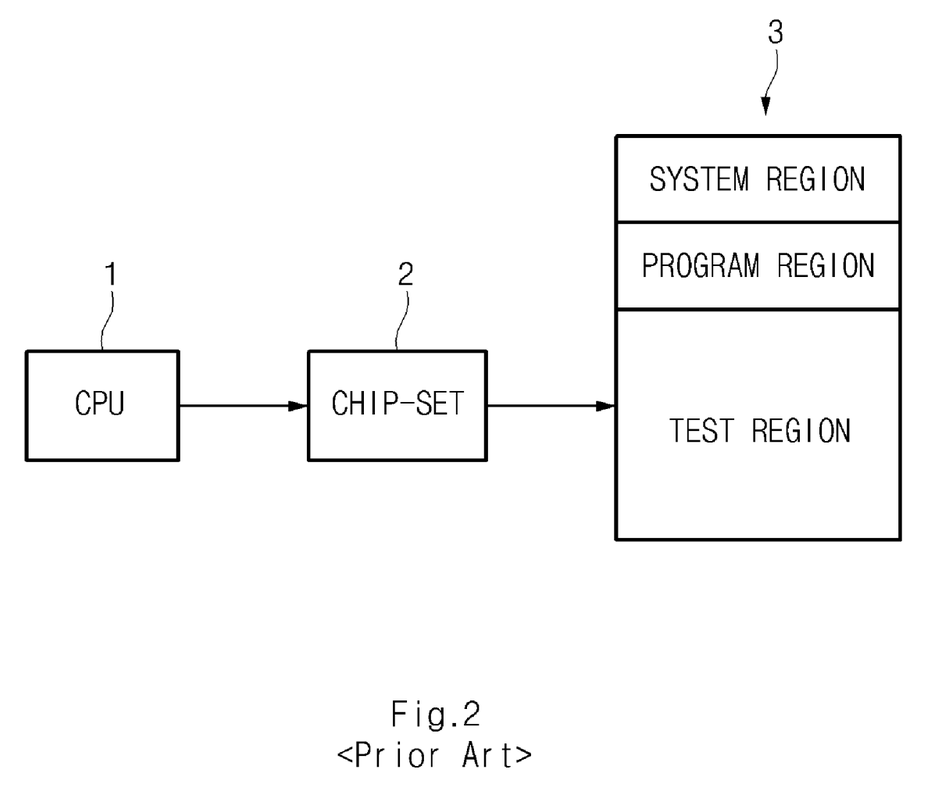
FIG. 2 is a conceptual diagram illustrating a March-Cache-OFF fail encountered in a conventional module device.

Meanwhile, FIG. 2 is a conceptual diagram illustrating a March-Cache-OFF fail encountered in a conventional module device.

Generally, as a representative method for testing a memory 3 such as a RAM in a Built In Self Test (BIST) circuit, a March-C algorithm can be used.

The March-C algorithm increases an address of the memory 3 simultaneously, writes a data value of '0' in all addresses of the memory 3, again performs address increasing, reads the increased addresses, and reduces such addresses in such a manner that the foregoing operations are repeated. After that, using the data value '1', the aforementioned operations are repeated. In this case, if the size of data is 2 bits or more, input data is configured in a combination pattern of two values '0' and '1', and a test for deciding the presence or absence of interference between data units assigned to the same address is performed. The above-mentioned phenomenon is referred to as a Data Back Ground function.

In order to test the memory 3 located on a board, the conventional method uses the BIST logic embedded in the memory 3 or uses a Central Processing Unit (CPU) 1. The chip Set 2 is connected between the CPU 1 and the memory 3, and performs address mapping.

The memory 3 includes a system region, a program region, and a test region. In this case, the program region stores information for carrying out a Cache-off test in the memory. During the execution of program, the program storing region is continuously accessed. A neighbor word line WL of the program region encounters a failure (also called a fail) of a specific address according to the increasing distant time.

The conventional device separately tests each of a passing gate screen item and a neighbor gate screen item using a quarter (¼) of the word line (WL) such that it can screen a low margin deterioration of the passing gate effect and the neighbor gate effect.

In this case, the pattern is prolonged, and the test time is also increased. In addition, the pattern detection capability is deteriorated so that direct fail of low margin deterioration occurs in a module, resulting in a March cache-off fail.

Figure 3:
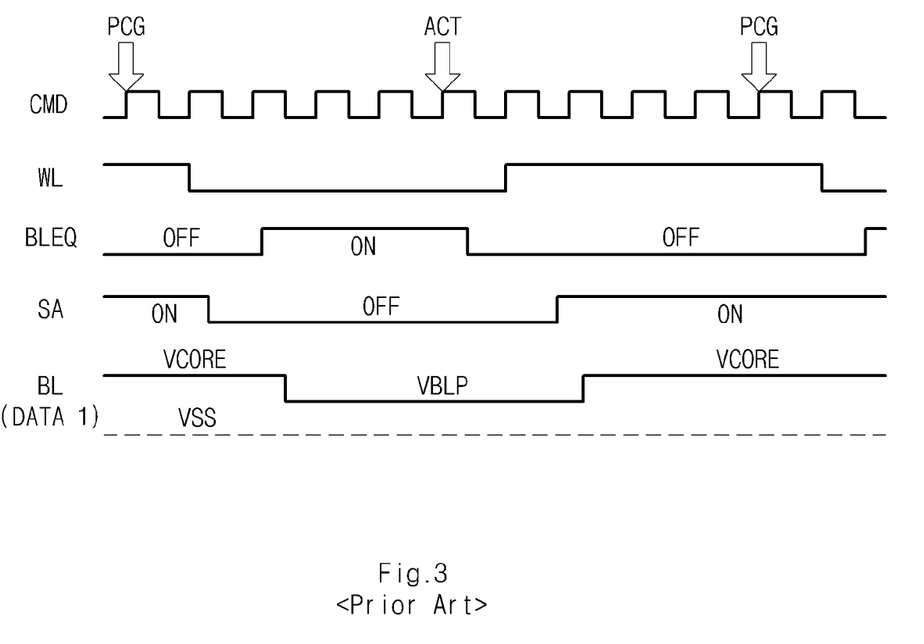
FIG. 3 is a timing diagram illustrating active and precharge operations of a conventional semiconductor device.

FIG. 3 is a timing diagram illustrating active and precharge operations of a conventional semiconductor device.

Referring to FIG. 3, the precharge command PCG allows the word line WL to be deactivated to a low level, and allows the sense amplifier SA to be turned off. In addition, the bit line precharge unit is activated to a high level during a normal activation time. Therefore, if data is set to '1', the bit line BL is equalized to a level of a bit line precharge voltage VBLP in response to a bit line equalization signal BLEQ. In this case, the bit line precharge voltage (VBLP) level is set to about 0.7 V higher than a level of a ground voltage (VSS).

After that, if the bit line precharge unit is deactivated, the bit line equalization signal BLEQ is deactivated to a low level. In addition, if the word line WL is activated to a high level by an active command ACT, electric charges are distributed to bit lines. Thereafter, the sense amplifier SA is turned on and then normally operated.

If data stored in a cell is set to '1', the bit line BL is increased to a level of a core voltage VCORE. The VCORE level is set to about 1.4 V higher than the precharge voltage VBLP level.

BRIEF SUMMARY OF THE INVENTION

Various embodiments of the present invention are directed to providing a semiconductor device and a method for testing the same that substantially obviate one or more problems due to limitations and disadvantages of the related art.

First, an embodiment of the present invention relates to a semiconductor device that allows a pair of bit lines to be equalized to a ground voltage level during a test mode, and simultaneously applies stress caused by the passing gate effect and stress caused by the neighbor gate effect to one cell during the test mode, thereby increasing the screen effect.

Second, an embodiment of the present invention relates to a semiconductor device that controls an even word line and an odd word line to be simultaneously enabled during the test mode, so that it can simultaneously test the passing gate effect and the neighbor gate effect.

Third, an embodiment of the present invention relates to a semiconductor device that stops operating the sense amplifier during the test mode, thereby increasing the effect for screening the passing gate effect and the neighbor gate effect.

Fourth, an embodiment of the present invention relates to a semiconductor that stores data using a 1 Row Bar (1 RB) scheme, performs a test by enabling all the even word lines, inverts data, enables all the odd word lines, and performs a test, resulting in a reduction in test time.

In accordance with one embodiment of the present invention, a semiconductor device includes a memory cell configured to store data; a sense amplifier configured to sense and amplify cell data received from the memory cell through a pair of bit lines, a bit line precharge unit configured to equalize the pair of bit lines to a ground voltage in response to a bit line equalization signal, a precharge voltage generator configured to provide the ground voltage to the bit line precharge unit during a test mode, and a test controller configured to maintain an activation state of the bit line equalization signal during a test mode period, and control the sense amplifier to be deactivated during the test mode.

In accordance with another embodiment of the present invention, a method for testing a semiconductor device includes writing data in a cell, activating a bit line equalization signal during a test mode period and thus precharging a plurality of bit lines with a ground voltage level, activating a word line during the test mode period and thus performing an active operation and a precharge operation, and if a read operation is started after the test mode period, detecting a leakage current fail of the plurality of bit lines.

In accordance with another embodiment of the present invention, a method for testing a semiconductor device includes writing first data in odd cells coupled to odd word lines, activating a bit line equalization signal during a first test mode period, and thus precharging a plurality of bit lines with a ground voltage level, activating all even word lines during the first test mode period, and thus performing an active operation and a precharge operation, detecting an electric potential of the pair of bit lines under a condition that the odd word lines are activated during a read operation after the first test mode period, and thus detecting a leakage current fail of the odd cells, writing second data in even cells coupled to even word lines, activating the bit line equalization signal during a second test mode period and thus precharging the pair of bit lines with the ground voltage level, activating all odd word lines during the second test mode period and thus performing the active operation and the precharge operation, and detecting an electric potential of the pair of bit lines under a condition that the even word lines are activated during a read operation after the second test mode period, and thus detecting a leakage current fail of the even cells.

In accordance with another embodiment of the present invention, a method for testing a semiconductor device includes preparing a semiconductor device having first binary information in a plurality of even word lines and having second binary information in a plurality of odd word lines, activating the plurality of even word lines and the plurality of odd word lines in response to an active command signal accompanying a test mode signal, and activating the plurality of even word lines and deactivating the plurality of odd word lines to read out the plurality of even word lines in response to the active command signal not accompanying the test mode signal.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 4:
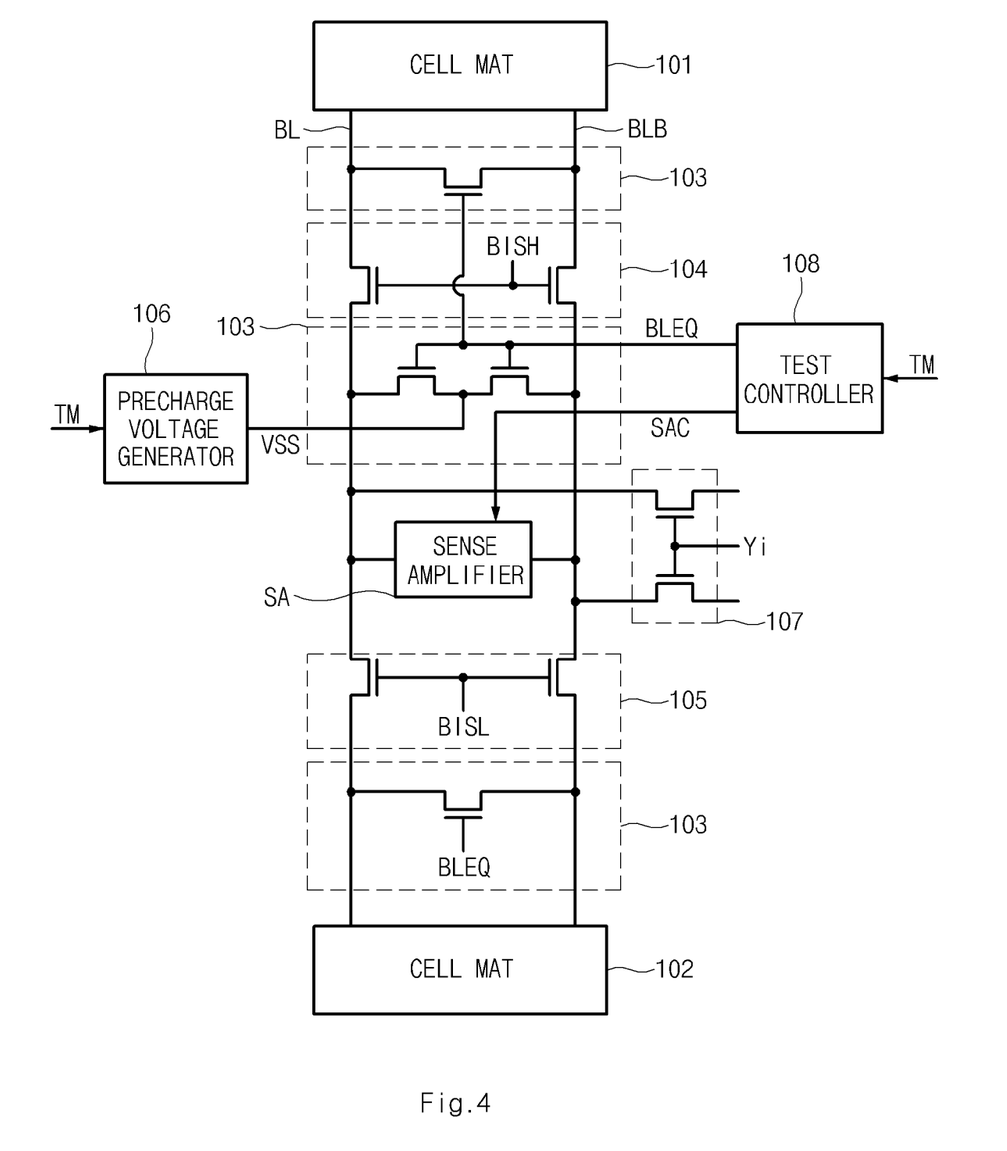
FIG. 4 is a circuit diagram illustrating a semiconductor device according to an embodiment of the present invention.

FIG. 4 is a circuit diagram illustrating a semiconductor device according to an embodiment of the present invention.

Referring to FIG. 4, a semiconductor device according to the present invention includes cell mats 101 and 102, a bit line precharge unit 130, switching units 104 and 105, a precharge voltage generator 106, a sense amplifier (SA), an output unit 107, and a test controller 108. In the embodiment shown in FIG. 4, two cell mats 101 and 102 are configured to share one sense amplifier SA. The cell mats 101 and 102 includes a memory cell.

A memory device, for example, the cell mats 101 and 102 of a DRAM, includes a plurality of bit lines and a plurality of word lines. In this case, the bit lines are arranged perpendicular to the word line. A cell transistor for storing data is arranged between a word line and a bit line. In this case, a gate of the cell transistor is coupled to the word line, a source is coupled to the bit line, and a drain is coupled to a capacitor.

The bit line precharge unit 103 equalizes the pair of bit lines (BL and BLB) to have a ground voltage (VSS) level in response to the bit line equalization signal (BLEQ). In the case of performing the precharge operation according to the embodiment of the present invention, the pair of bit lines BL and BLB is not precharged with a precharge voltage (VBLP) level, and is equalized to the ground voltage (VSS) level.

The precharge voltage generator 106 provides the ground voltage (VSS) to the bit line precharge unit 103 according to a test mode (TM) signal.

Therefore, the present invention allows stress caused by the passing gate effect and another stress caused by the neighbor gate effect to be simultaneously applied to one cell during the test mode, thereby increasing the screen effect.

The switching units 104 and 105 may selectively control the connection between the pair of bit lines BL and BLB and each cell mat 101 or 102 in response to control signals BISH and BISL.

The sense amplifier SA senses and amplifies the sensing voltage of data received from the cell mats 101 and 102. During the read operation, the output unit 107 senses and outputs data of the pair of bit lines BL and BLB in response to the column selection signal Yi.

During the test mode, if the test mode (TM) signal is activated, the test controller 108 delays the bit line equalization signal BLEQ for a predetermined period of time and outputs the delayed bit line equalization signal BLEQ. If necessary, the test controller 108 may include a delay circuit and the like. During the test mode, the test controller 108 outputs the bit line equalization signal BLEQ and the sense amplifier control signal SAC to control a test operation in response to a combination of test codes.

In addition, if the test mode (TM) signal is activated in the test mode, the operation of the sense amplifier SA is stopped in response to the sense amplifier control signal SAC. Therefore, the core voltage VCORE is not applied to the sense amplifier SA during the activation time of the TM signal, so that a develop operation is not achieved.

Figure 5:
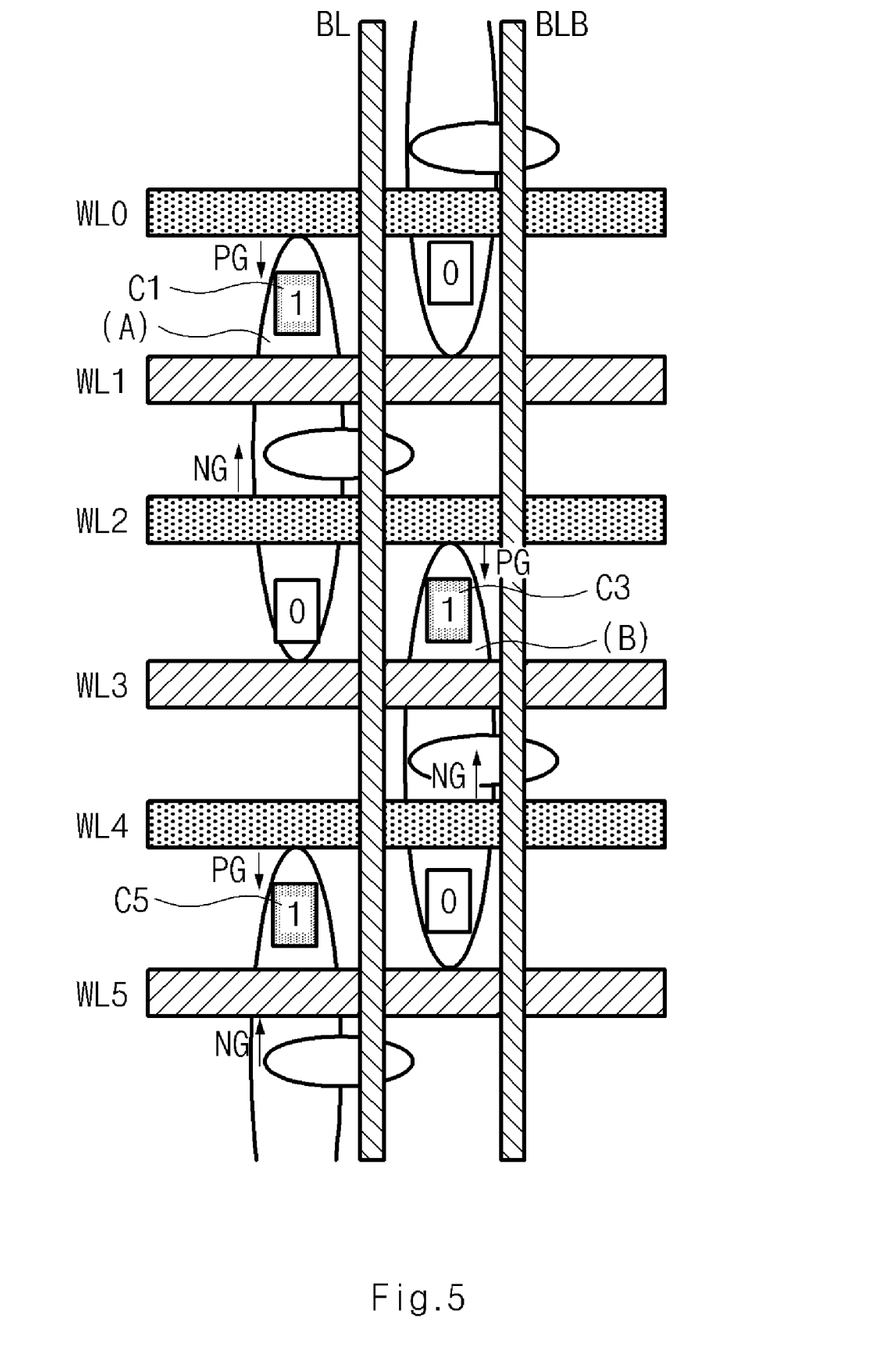
FIGS. 5 and 6 are conceptual diagrams illustrating a passing gate effect and a neighbor gate effect encountered in a cell transistor according to an embodiment of the present invention.
Figure 6:
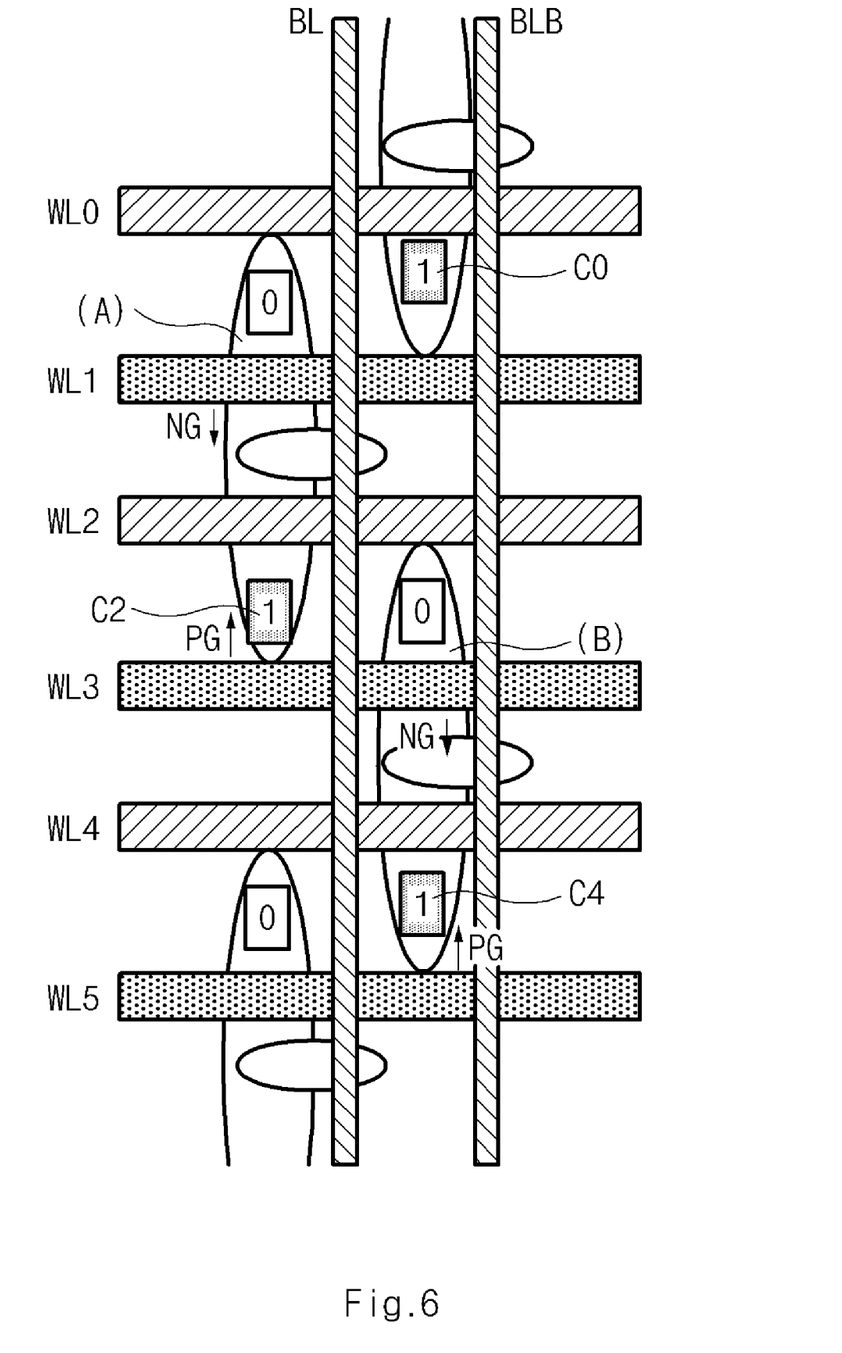

FIGS. 5 and 6 are conceptual diagrams illustrating a passing gate effect and a neighbor gate effect in a cell transistor according to an embodiment of the present invention.

FIG. 5 is a conceptual diagram illustrating a method for storing data when all the even word lines (WL0, WL2 and WL4) are activated.

Referring to FIG. 5, a semiconductor device according to the present invention includes a plurality of word lines (WL0~WL5), a pair of bit lines (BL and BLB), and active regions (A and B). In accordance with the present invention, two data units are alternately and repeatedly written in the active regions A and B according to the 1RB (1 Row Bar) scheme. That is, data of value '0' and data of value '1' are alternately written in all cells along each word line WL according to a checkerboard scheme.

In accordance with the present invention, different data values are written in the same active region A, and different data values are written in different active regions A and B, on the basis of a specific area between the word line WL2 and the word line WL3.

For example, data of value '1' and data of value '0' are stored in each cell within the same active region A. Data of value '1' and data of value '0' are stored in each cell within the same active region B. On the other hand, different active regions A and B store data of value '0' and data of value '1', respectively, on the basis of a specific area between the word line WL2 and the word line WL3.

FIG. 6 is a conceptual diagram illustrating a method for storing data when all odd word lines (WL1, WL3 and WL5) are activated after the inversion of data.

Referring to FIG. 6, a semiconductor device according to the present invention includes a plurality of word lines (WL0~WL5), a pair of bit lines (BL and BLB), and active regions A and B. In accordance with the present invention, two data units are alternately and repeatedly written in the active region A according to the 1RB (1 Row Bar) scheme.

That is, different data values are written in the same active region A, and different data values are written in different active regions A and B.

For example, data of value '1' and data of value '0' are stored in the same active region A. Data of value '1' and data of value '0' are stored in each cell within the same active region B. On the other hand, different active regions A and B store data of value '0' and data of value '1', respectively, on the basis of a specific area between the word line WL2 and the word line WL3.

In accordance with the present invention, data of value '1' is written in each of the odd cells (C1, C3 and C5) connected to the odd word lines (WL1,WL3,WL5) as shown in FIG. 5. In addition, all even word lines (WL0, WL2 and WL4) are activated in the test mode, so that the active operation ACT and the precharge operation PCG are repeatedly performed. That is, all the even word lines having even row addresses are enabled.

Therefore, stress caused by the passing gate effect and stress caused by the neighbor gate effect are simultaneously applied to the odd cells C1, C3 and C5, each of which has data of value '1'.

Subsequently, after the test mode is reset, data of the odd cells C1, C3 and C5 is read. That is, the semiconductor device reads data of only the odd cells (C1, C3 and C5) to which the passing gate effect and the neighbor gate effect are applied by even word lines, and thus screens cells in which an off-leakage current occurs.

After that, as shown in FIG. 6, inverted data is stored in all cells. That is, as shown in FIG. 6, data of value '1' is written in the even cells C0, C2 and C4 coupled to the even word lines WL0, WL2 and WL4. In addition, all odd word lines WL1, WL3 and WL5 are activated in the test mode, so that the active operation ACT and the precharge operation PCG are repeatedly performed. That is, all the odd word lines WL0, WL2 and WL4, a row address of which is an odd number, are enabled.

Accordingly, stress caused by the passing gate effect and stress caused by the neighbor gate effect are simultaneously applied to the even cells (C0, C2 and C4) each having data of value '1'.

Subsequently, after the test mode is reset, data of the even cells C0, C2 and C4 can be read. In other words, the semiconductor device reads data of only the even cells (C0, C2 and C4) to which the passing gate effect and the neighbor gate effect are applied by odd word lines, and thus screens cells in which an off-leakage current occurs.

In FIGS. 5 and 6, the bit line equalization signal BLEQ is activated in the test mode, so that the bit line precharge unit 103 can maintain its equalization state. In addition, during the test mode, the pair of bit lines BL and BLB is equalized to the ground voltage (VSS) level in response to an output signal of the precharge voltage generator 106, so that an off-leakage current occurs, as shown in FIGS. 5 and 6.

In FIGS. 5 and 6, PG means a specific state in which a leakage current caused by the passing gate effect occurs, and NG means a specific state in which a leakage current occurs caused by the neighbor gate effect occurs.

Figure 7:
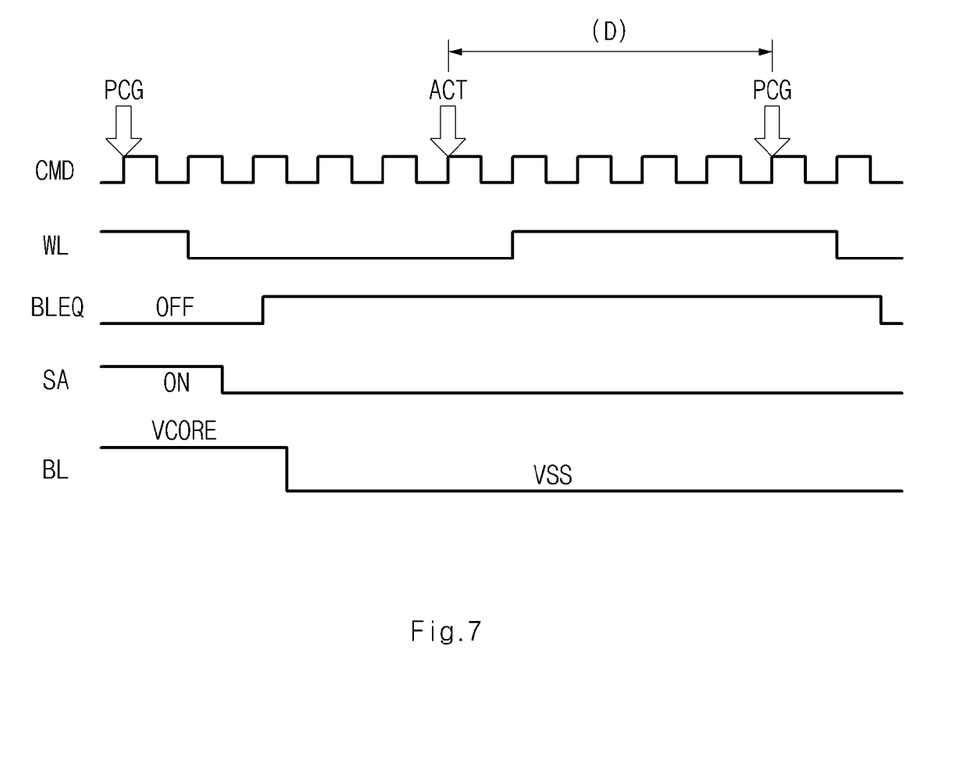
FIG. 7 is a timing diagram illustrating active and precharge operations of a semiconductor device according to an embodiment of the present invention.

FIG. 7 is a timing diagram illustrating active and precharge operations of a semiconductor device according to an embodiment of the present invention.

First, by means of the precharge command, the word line WL of the cell mat 101 is deactivated to a low level, and the sense amplifier SA is turned off. After that, the bit line precharge unit 103 is activated to a high level during the normal activation time.

As a result, if data stored in the cell is determined to be '1', the pair of bit lines BL and BLB is equalized into the ground voltage (VSS) level according to the bit line equalization signal BLEQ. In this case, the ground voltage (VSS) level may be set to about zero volt (0 V) lower than the level of the bit line precharge voltage VBLP.

After that, the word line WL is activated to a high level in response to the active command ACT. In this case, if the test mode (TM) signal is activated, the test controller 108 maintains the bit line equalization signal BLEQ for a predetermined period of time without any change. That is, when the test mode starts operation, the precharge state can be maintained irrespective of the active command ACT. Therefore, the bit line equalization signal BLEQ can maintain a high level before the beginning of the next precharge command PCG.

In this case, the period D indicates a specific period in which the test mode signal (TM) is activated. The period D includes not only one period in which each even word line is activated as shown in FIG. 5, but also another period in which each odd word line is activated as shown in FIG. 6.

During the period D, the sense amplifier SA stops operation upon receiving the sense amplifier control signal SAC from the test controller 108. In addition, the ground voltage VSS is applied to the bit line precharge unit 103 in response to an output signal of the precharge voltage generator 106. Therefore, during a specific period in which the bit line equalization signal BLEQ is activated to a high level, the pair of bit lines BL and BLB is equalized to the ground voltage (VSS) level. As a result, there arises an environment in which the off-leakage current occurs in the cell storing data of value '1'.

Figure 8:
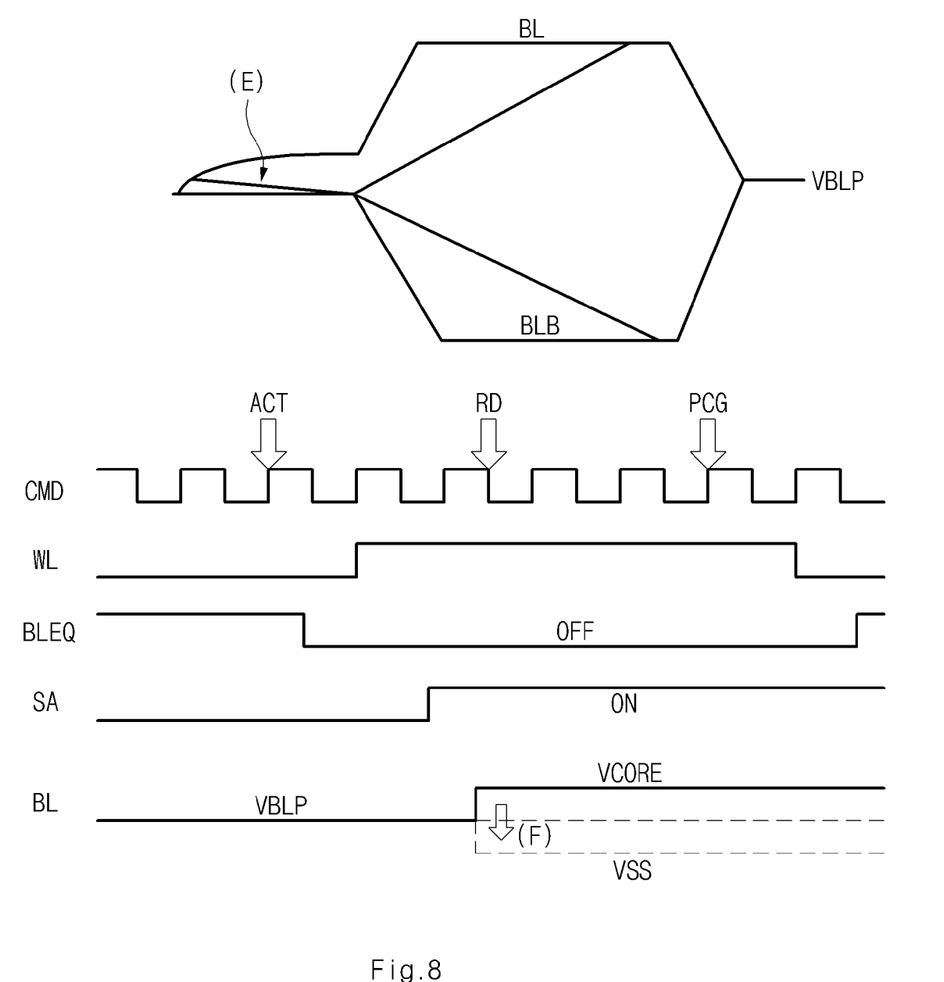
FIG. 8 is a timing diagram illustrating a read operation of a semiconductor device according to an embodiment of the present invention.

FIG. 8 is a timing diagram illustrating a read operation of a semiconductor device according to an embodiment of the present invention. The embodiment of FIG. 8 simultaneously applies stress to the odd cells C1, C3 and C5, each of which has data of value '1' as shown in FIG. 5, and reads data of the odd cells C1, C3 and C5.

First, if the bit line precharge unit 103 is deactivated by the active command ACT, the bit line equalization signal BLEQ is deactivated to a low level. In addition, if the word line WL is activated to a high level, charges are distributed to the pair of bit lines BL and BLB. Thereafter, the sense amplifier SA is turned on and begins to operate.

Thereafter, upon receiving a read command RD, data stored in the odd cells C1, C3 and C5 is applied to the bit line BL. That is, during the read operation, the odd word lines WL1, WL3 and WL5 coupled to the odd cells C1, C3 and C5 are enabled and thus the read operation is carried out.

In the case of a normal operation in which an off-leakage current is not generated, data of value '1' is stored in the cell, and thus the bit line BL is increased to the core voltage (VCORE) level. In this case, the core voltage (VCORE) level is set to about 1.4 V higher than the bit line precharge voltage (VBLP) level.

In contrast, in accordance with the test method shown in FIG. 8 according to the present invention, stress is applied to the odd cells C1, C3 and C5, each of which has data of value '1'. Therefore, a leakage current of data '1' occurs, thereby causing a fail as denoted by 'F'. In other words, if a leakage current occurs in the odd cells C1, C3 and C5, a sensing failure may occur and the bit line (BL) voltage is reduced as denoted by 'E', or an inversion of data may also occur.

Therefore, the semiconductor device reads data of the odd cells C1, C3 and C5 to which the passing gate effect and the neighbor gate effect are applied by even word lines WL0, WL2 and WL4, and thus screens cells in which an off-leakage current occurs.

After that, the word line WL is deactivated to a low level by the precharge command PCG, and the sense amplifier SA is turned off. Thereafter, the bit line precharge unit 103 is deactivated to a high level. As a result, if data is set to '1', the bit line BL is equalized to a level of the bit line precharge voltage VBLP in response to the bit line equalization signal BLEQ. In this case, the bit line precharge voltage (VBLP) level is set to about 0.7 V higher than a level of the ground voltage (VSS).

As apparent from the above description, the embodiments of the present invention have the following effects.

First, an embodiment of the present invention relates to a semiconductor device that allows a pair of bit lines to be equalized to a ground voltage level during a test mode, and simultaneously applies stress caused by the passing gate effect and stress caused by the neighbor gate effect to one cell during the test mode, thereby increasing the screen effect.

Second, an embodiment of the present invention relates to a semiconductor device that controls an even word line and an odd word line to be simultaneously enabled during the test mode, so that it can simultaneously test the passing gate effect and the neighbor gate effect.

Third, an embodiment of the present invention relates to a semiconductor device that stops operating the sense amplifier during the test mode, thereby increasing the effect for screening the passing gate effect and the neighbor gate effect.

Fourth, an embodiment of the present invention relates to a semiconductor that stores data using a 1RB (1 Row Bar) scheme, performs a test by enabling all the even word lines, inverts data, enables all the odd word lines, and performs a test, resulting in a reduction in test time.

Fifth, an embodiment of the present invention relates to a semiconductor device that can previously screen a latent failed part that may be encountered in a packaging step after the wafer processing, during a probe test step.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a memory cell configured to store data;
   a sense amplifier configured to sense and amplify cell data received from the memory cell through a pair of bit lines;
   a bit line precharge unit configured to equalize the pair of bit lines to a ground voltage in response to a bit line equalization signal;
   a precharge voltage generator configured to provide the ground voltage to the bit line precharge unit during a test mode; and
   a test controller configured to maintain an activation state of the bit line equalization signal during a test mode period and control the sense amplifier to be deactivated during the test mode.

2. The semiconductor device according to claim 1, wherein:
   during the test mode, a leakage current caused by a passing gate effect and a neighboring gate effect is screened.

3. The semiconductor device according to claim 1, wherein:
   if the test mode signal is activated in the test mode, the test controller controls the bit line equalization signal to be maintained at a high level during the test mode period including an active command and a precharge command.

4. The semiconductor device according to claim 1, wherein the memory cell stores data of '1' in odd cells coupled to odd word lines, and activates even word lines during the test mode.

5. The semiconductor device according to claim 4, wherein the memory cell stores different data units in the same active region.

6. The semiconductor device according to claim 4, wherein the memory cell stores different data units in different active regions.

7. The semiconductor device according to claim 4, wherein:

after execution of the test mode, the odd word lines are enabled in a read operation such that the odd cells are screened.

8. The semiconductor device according to claim 1, wherein the memory cell stores data of '1' in even cells coupled to even word lines, and activates all odd word lines during the test mode.

9. The semiconductor device according to claim 8, wherein the memory cell stores different data units in the same active region.

10. The semiconductor device according to claim 8, wherein the memory cell stores different data units in different active regions.

11. The semiconductor device according to claim 8, wherein:
   after execution of the test mode, the even word lines are enabled in a read operation such that the even cells are screened.

12. A method for testing a semiconductor device comprising:
   writing data in a cell;
   activating a bit line equalization signal during a test mode period, and thus precharging a plurality of bit lines with a ground voltage level;
   activating a word line during the test mode period, and thus performing an active operation and a precharge operation; and
   if a read operation is started after the test mode period, detecting a leakage current fail of the plurality of bit lines.

13. The method according to claim 12, further comprising:
   stopping operation of a sense amplifier during the test mode period.

14. The method according to claim 12, wherein the plurality of bit lines include odd bit lines and even bit lines, wherein the performing of the active operation and the precharge operation includes:
   activating the even word lines when data of '1' is stored in odd cells coupled to the odd word lines; and
   activating the odd word lines when data of '1' is stored in even cells coupled to even word lines.

15. The method according to claim 14, the method further comprising:
   during the read operation,
   screening the odd cells by enabling the odd word lines; and
   screening the even cells by enabling the even word lines.

16. The method according to claim 12, wherein the detecting of the leakage current fail includes detecting a leakage current caused by a passing gate effect and a neighbor gate effect.

17. The method according to claim 12, wherein the writing of data in the cell includes storing different data units in the same active region.

18. The method according to claim 12, wherein the writing of data in the cell includes storing different data units in different active regions.

19. A method for testing a semiconductor device comprising:
   writing first data in odd cells coupled to odd word lines;
   activating a bit line equalization signal during a first test mode period, and thus precharging a plurality of bit lines with a ground voltage level;
   activating all even word lines during the first test mode period, and thus performing an active operation and a precharge operation;
   detecting an electric potential of the pair of bit lines under a condition that the odd word lines are activated during a read operation after the first test mode period, and thus detecting a leakage current fail of the odd cells;

writing second data in even cells coupled to even word lines;

activating the bit line equalization signal during a second test mode period, and thus precharging the pair of bit lines with the ground voltage level;

activating all odd word lines during the second test mode period, and thus performing the active operation and the precharge operation; and detecting an electric potential of the pair of bit lines under a condition that the even word lines are activated during a read operation after the second test mode period, and thus detecting a leakage current fail of the even cells.

20. The method according to claim 19, further comprising stopping operation of a sense amplifier during the first and second test mode periods.

21. The method according to claim 19, wherein the detecting of the leakage current fail includes detecting a leakage current caused by a passing gate effect and a neighbor gate effect.

22. A method for testing a semiconductor device comprising:

preparing a semiconductor device having first binary information in a plurality of even word lines and having second binary information in a plurality of odd word lines;

activating the plurality of even word lines and the plurality of odd word lines in response to an active command signal accompanying a test mode signal; and activating the plurality of even word lines and deactivating the plurality of odd word lines to read out the plurality of even word lines in response to the active command signal not accompanying the test mode signal.

23. The method of claim 22, wherein a precharge operation is enabled in response to an active command signal accompanying the test mode signal, and wherein the precharge operation is disabled in response to an active command signal not accompanying the test mode signal.

24. The method of claim 22, wherein a sense amplifier is disabled in response to an active command signal accompanying the test mode signal, wherein the sense amplifier is enabled in response to an active command signal not accompanying the test mode signal, wherein each of the even word lines has a plurality of even word line cells and each of the odd word lines has a plurality of odd word line cells, and wherein the even word line cells and the odd word line cells are arranged in an alternating manner either in a first direction or a second direction angled to the first direction.

* * * * *